United States Patent
Kim

(10) Patent No.: US 6,249,151 B1
(45) Date of Patent: Jun. 19, 2001

(54) INVERTER FOR OUTPUTTING HIGH VOLTAGE

(75) Inventor: Byung-Doo Kim, Kumi (KR)

(73) Assignee: Hyundai Electronics Industries Co., Ltd., Seoul (KR)

(*) Notice: Subject to any disclaimer, the term of this patent is extended or adjusted under 35 U.S.C. 154(b) by 0 days.

(21) Appl. No.: 09/473,719

(22) Filed: Dec. 29, 1999

(30) Foreign Application Priority Data

Jun. 29, 1999 (KR) .................................................. 99-25117

(51) Int. Cl.$^7$ .............................................. H03K 19/0948

(52) U.S. Cl. ......................... 326/121; 326/119; 326/112

(58) Field of Search ................................. 326/68, 81, 83, 326/112, 119, 121

(56) References Cited

U.S. PATENT DOCUMENTS

| | | | |
|---|---|---|---|
| 5,465,054 | 11/1995 | Erhart | 326/34 |
| 5,539,334 | 7/1996 | Clapp, III et al. | 326/68 |
| 5,604,449 | 2/1997 | Erhart et al. | 326/81 |
| 5,939,932 | * 8/1999 | Lee | 327/436 |

* cited by examiner

Primary Examiner—Michael Tokar
Assistant Examiner—Anh Q. Tran
(74) Attorney, Agent, or Firm—Fleshner & Kim, LLP

(57) ABSTRACT

The present invention relates to an inverter for outputting high voltage in use of CMOS transistors of low voltage, more particularly, to a circuit generating a high voltage output without subsidiary shield voltage. The present invention, wherein an inverter circuit generates high voltage in use of low voltage transistors, includes a first PMOS of which gate is supplied with a high input signal and of which source is connected to a power supply terminal, a second PMOS of which source is connected to a drain of the first PMOS and of which drain is connected to an output terminal, a first NMOS of which gate is connected to a low input signal and of which source is connected to a ground terminal, a second NMOS of which source is connected to a drain of the first NMOS and of which drain is connected to the output terminal, a third PMOS of which gate and source is connected to a high input signal and of which drain is connected to a gate of the second PMOS, and a third NMOS of which gate and source are connected to a low input signal and of which drain is connected to a gate of the second NMOS and the drain of the third PMOS.

10 Claims, 3 Drawing Sheets

INVERTER FOR OUTPUTTING HIGH VOLTAGE

BACKGROUND OF THE INVENTION

1. Field of Invention

The present invention relates to an inverter for outputting high voltage in use of CMOS transistors of low voltage, more particularly, to a circuit generating a high voltage output without subsidiary shield voltage.

2. Discussion of Related Art

An inverter circuit for outputting high voltage outputs generates a high voltage output fluctuating within high voltage range from an input signal fluctuating within low voltage range. It is all right to constitute such a circuit with transistors which can resist against high voltage. Yet, it is very difficult to constitute such a circuit for generating high voltage with transistors for low voltage.

As it is a trend to constitute semiconductor circuits with transistors operated by low voltage, it is very difficult to constitute integrated circuits with other transistors for high voltage. Therefore, circuits for high voltage are constituted by a method which prevents transistors for low voltage from being supplied with high voltage in use of both shield voltage of middle voltage to generate high voltage and some transistors operated by low voltage, i.e., the transistors (hereinafter abbreviated low voltage transistors) which fails to resist high voltage of an output voltage from a circuit.

FIG. 1 shows an example of an inverter circuit for generating high voltage outputs.

Referring to FIG. 1, shield voltage Vshield is applied to a gate terminal, drains of a second PMOS P2 and a second NMOS N2 are connected to an output terminal, input voltage INH ranging between VDD and Vshield is applied to a gate of a first PMOS P1, a source terminal of the first PMOS P1 is connected to VDD, a drain terminal of the first PMOS P1 is connected to a source of the second PMOS P2, a gate of a first NMOS N1 is supplied with input voltage INL ranging between Vshield and VSS, and a drain terminal of the first NMOS N1 is connected to the drain of the second NMOS N2. Vshield amounts to half of the voltage ranging between VDD and VSS. And, input voltage of the first PMOS ranges from Vshield to VDD while another input voltage of the first NMOS ranges between Vshield and VSS.

The operation of the inverter for outputting high voltage of the related art will be explained provided that VDD=10V, VSS=0V, Vshield=5V, INH between 10V~5V, INL between 5V~0V, and all are in the same phase. Besides, each threshold voltage of the NMOS and PMOS is supposed to be 1V.

Once INH and INL become 10V and 5V respectively, N1 becomes turned on but P1 becomes turned off. Thus a node b becomes 0V(VSS) as N1 becomes turned on. And, another node OUT becomes 0V(VSS) as N2 becomes turned on by Vshield. Besides, other node a is supplied with voltage of 6V resulted from the voltage by adding threshold voltage of P2 to Vshield as P1 is turned off.

Thus, the node a, OUT node, and node b are 6V, 0V, and 0V respectively. Therefore, the circuit generates 0V(VSS) ranging within breakdown voltage of low voltage CMOS transistors.

Otherwise, N1 and P1 become turned off and on respectively provided that INH and INL become 5V and 0V, respectively. Thus, the node a becomes 10V(VDD) as P1 becomes turned on and the OUT node becomes 10V(VDD) as P2 becomes turned on by Vshield. Moreover, as N1 is turned off, the node b is dupplied with the voltage of 4V resulted from subtracting Vshield by threshold voltage of N2.

Thus, the node a, node OUT, and node b are 10V, 10V, and 4V respectively. Therefore, the circuit generates 10V(VDD) ranging within breakdown voltage of low voltage CMOS transistors.

Accordingly, the inverter for outputting high voltage generates a high voltage output(between VDD and VSS) from an input ranging between VDD and Vshield or between Vshield and VSS within low voltage input range.

DC voltage of Vshield having about (VDD+VSS)/2 is required, as shown in FIG. 1, for generating a high voltage output. In order to make the voltage of Vshield, DC voltage is inputted from outside or a Vshield voltage generator is necessary. Therefore, reliance of the circuit is decreased as the gates of N2 and P2 are supplied with DC voltage continuously.

SUMMARY OF THE INVENTION

Accordingly, the present invention is directed to an inverter for outputting high voltage that substantially obviate one or more of the problems due to limitations and disadvantages of the related art.

The object of the present invention is to provide an inverter for outputting high voltage which improves the problems of the related art without using shield voltage.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings. To achieve these and other advantages and in accordance with the purpose of the present invention, as embodied and broadly described, the present invention, wherein an inverter circuit generates high voltage in use of low voltage transistors, includes a first PMOS of which gate is supplied with a high input signal and of which source is connected to a power supply terminal, a second PMOS of which source is connected to a drain of the first PMOS and of which drain is connected to an output terminal, a first NMOS of which gate is connected to a low input signal and of which source is connected to a ground terminal, a second NMOS of which source is connected to a drain of the first NMOS and of which drain is connected to the output terminal, a third PMOS of which gate and source is connected to a high input signal and of which drain is connected to a gate of the second PMOS, and a third NMOS of which gate and source are connected to a low input signal and of which drain is connected to a gate of the second NMOS and the drain of the third PMOS. It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Reference will now be made in detail to the preferred embodiments of the present invention, examples of which are illustrated in the accompanying drawings.

Figure 1:
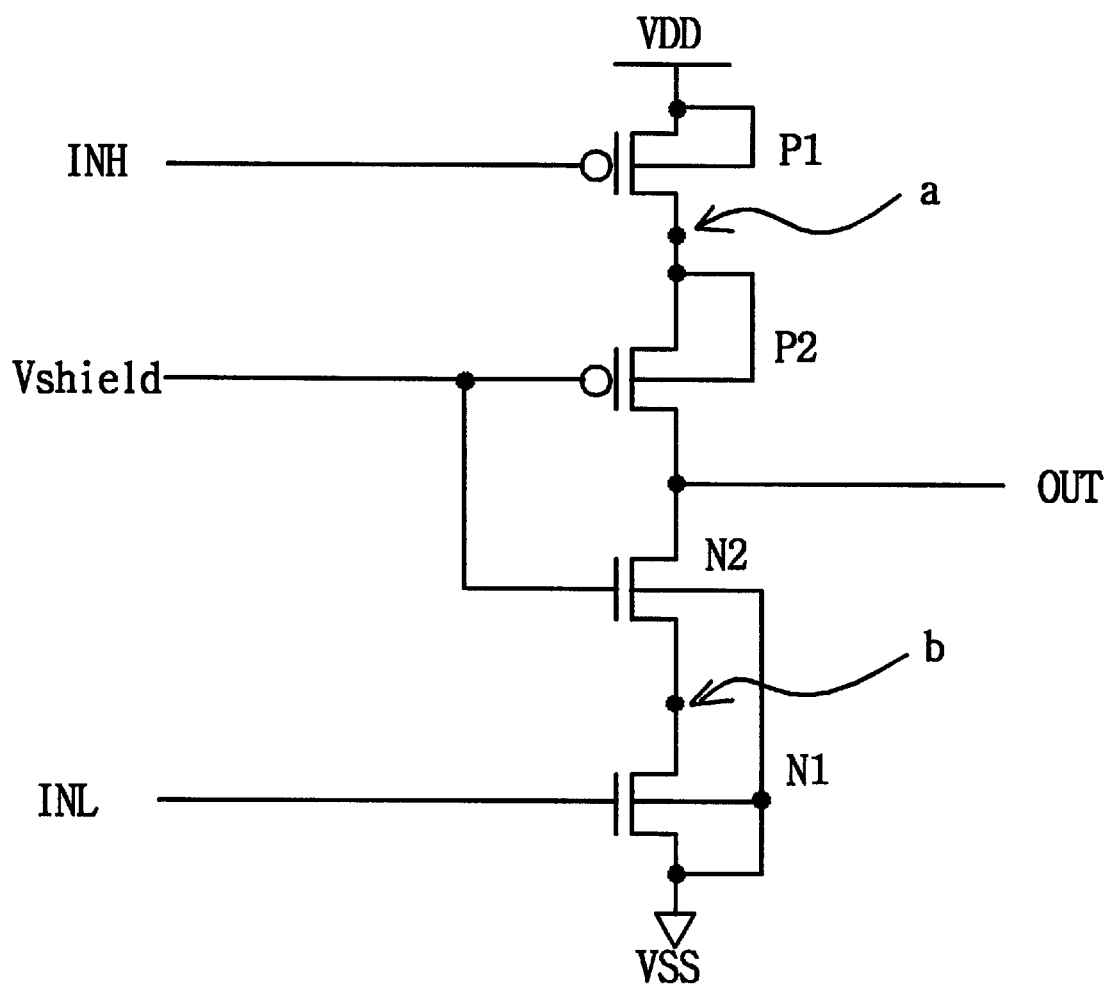
FIG. 1 shows an inverter circuit for generating high voltage outputs according to a related art.
Figure 2:
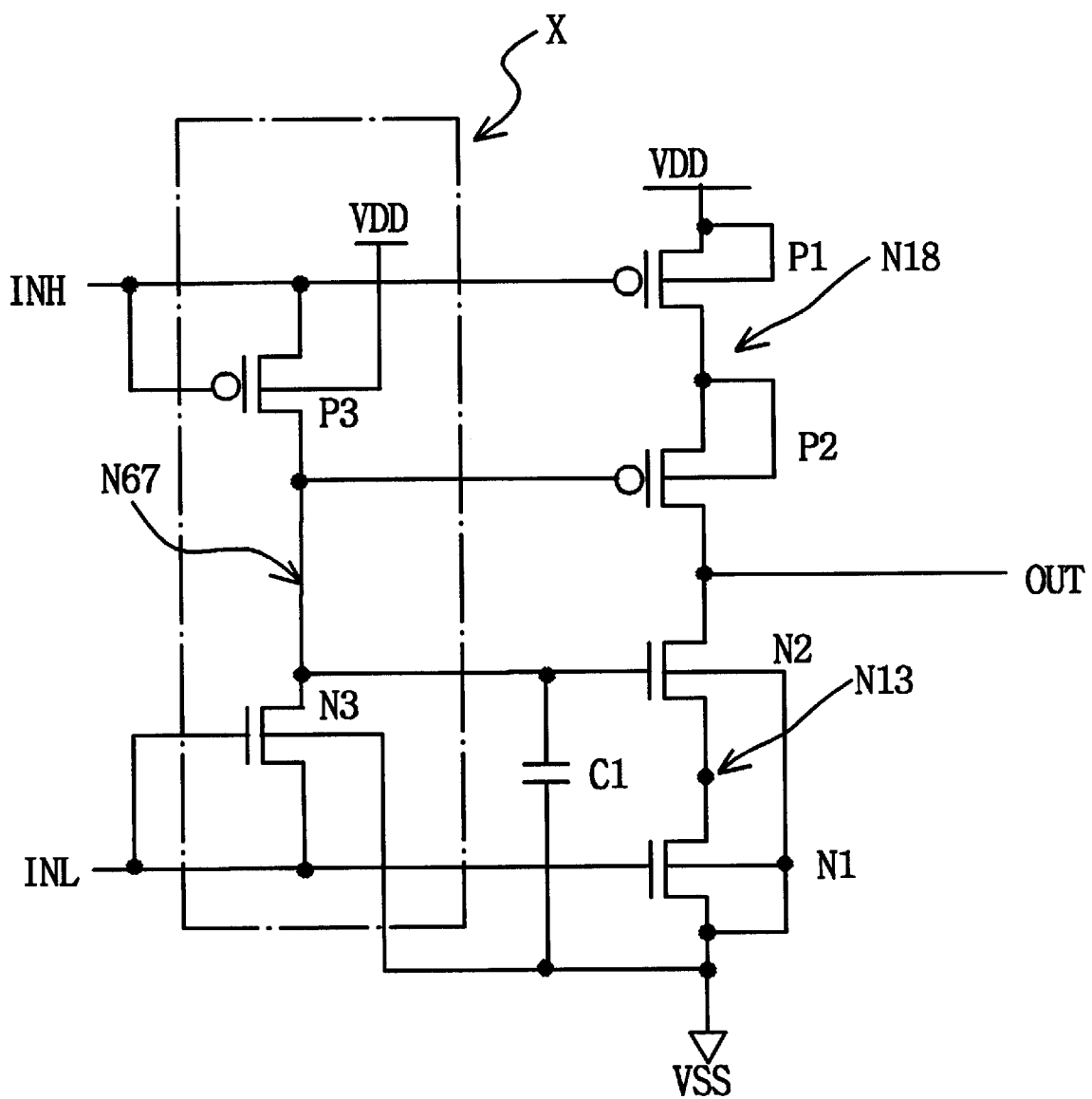
FIG. 2 shows an inverter circuit for generating high voltage outputs according to the present invention.

FIG. 2 shows an inverter circuit for generating high voltage outputs according to the present invention, where circuit devices work the same function in FIG. 1 are designated by the same signs. Referring to FIG. 2, instead of applying the voltage Vshield to the inverter circuit of the related art in FIG. 1, gate input terminals of second PMOS and NMOS P2 and N2 are connected to a common terminal of a third PMOS and NMOS P3 and N3. The rest terminals of third PMOS and NMOS P3 and N3 are connected to their own gates respectively. thus, the third PMOS P3 is connected to a high input signal INH while the third NMOS N3 is connected to a low input signal INL.

Namely, in addition to the inverter circuit of the related art which includes the second PMOS and NMOS P2 and N2 of which drains are connected to an output terminal, the first PMOS P1 of which gate is supplied with input voltage INH and of which source and drain terminals are connected to VDD and a source of the second PMOS P2 respectively, and the first NMOS N1 of which gate is supplied with input voltage INL and of which drain terminal is connected to a drain of the second NMOS N2, the high voltage output is attained by connecting an X block comprising third PMOS and NMOS P3 and N3 to an input terminal having a low voltage input range.

Voltage fluctuation of a high input signal ranges between (VDD+VSS)/2 and VDD. And, The other voltage fluctuation of a low input signal ranges between (VDD+VSS)/2 and VSS. The phases of the high and low input signals are of the same. Reliance of the circuit is greatly increased by connecting a capacitor between a ground terminal and the node between the drains of the third PMOS and NMOS to prevent over-shoot on voltage fluctuation.

Bulks of the first and second PMOS and NMOS are connected to their own sources, a bulk of the third PMOS is connected to power supply, and another bulk of the third NMOS is connected to a ground terminal.

Such constitution of the inverter circuit of the present invention works as follows.

Once INH and INL are 10V and 5V respectively, the first and third PMOS P1 and P3 become turned off whole the first NMOS N1 becomes turned on. One node N67 of the third NMOS N3 is supplied with the voltage of 4V resulted from subtracting the input voltage INL by threshold voltage of N3 as the N3 becomes a diode mode. Moreover, as the first NMOS N1 is turned on while INL is 5V, a node N13 becomes 0V(VSS). Thus, a node OUT becomes 0V(VSS) as the node is 4V enough to turn on the second NMOS N2.

As INH is 10V, the first PMOS P1 becomes turned off. And, as the node N67 is supplied with 4V, a node N18 becomes 5V resulted from adding threshold voltage of P2 to the voltage of node N67. Thus, the node N67, node N18, and node 13 are 4V, 5V, and 0V respectively. Therefore, the circuit operates within breakdown voltage of low voltage CMOS transistors.

Otherwise, the first NMOS N1 becomes turned off as soon as the voltage of the node N13 rises provided that INH and INL become 5V and 0V, respectively. Therefore, charge pumping is generated to increase the voltage of the node N67. The voltage increase of the node N67 amounts to 6V resulted from adding threshold voltage of the third PMOS to the voltage INH of 5V of the gate of the third PMOS. As the input voltage INH is 5V, the node N18 is supplied with 10V when the first PMOS P1 is turned on, and the node OUT is also supplied with 10V(VDD) as the second PMOS P2 is turned on by 6V at the node N67.

As the first NMOS N1 is turned off and the gate of the second NMOS is supplied with 6V, the node N13 is supplied with 5V resulted from subtracting the voltage at the node N67 by threshold voltage of the second NMOS N2.

Figure 3:
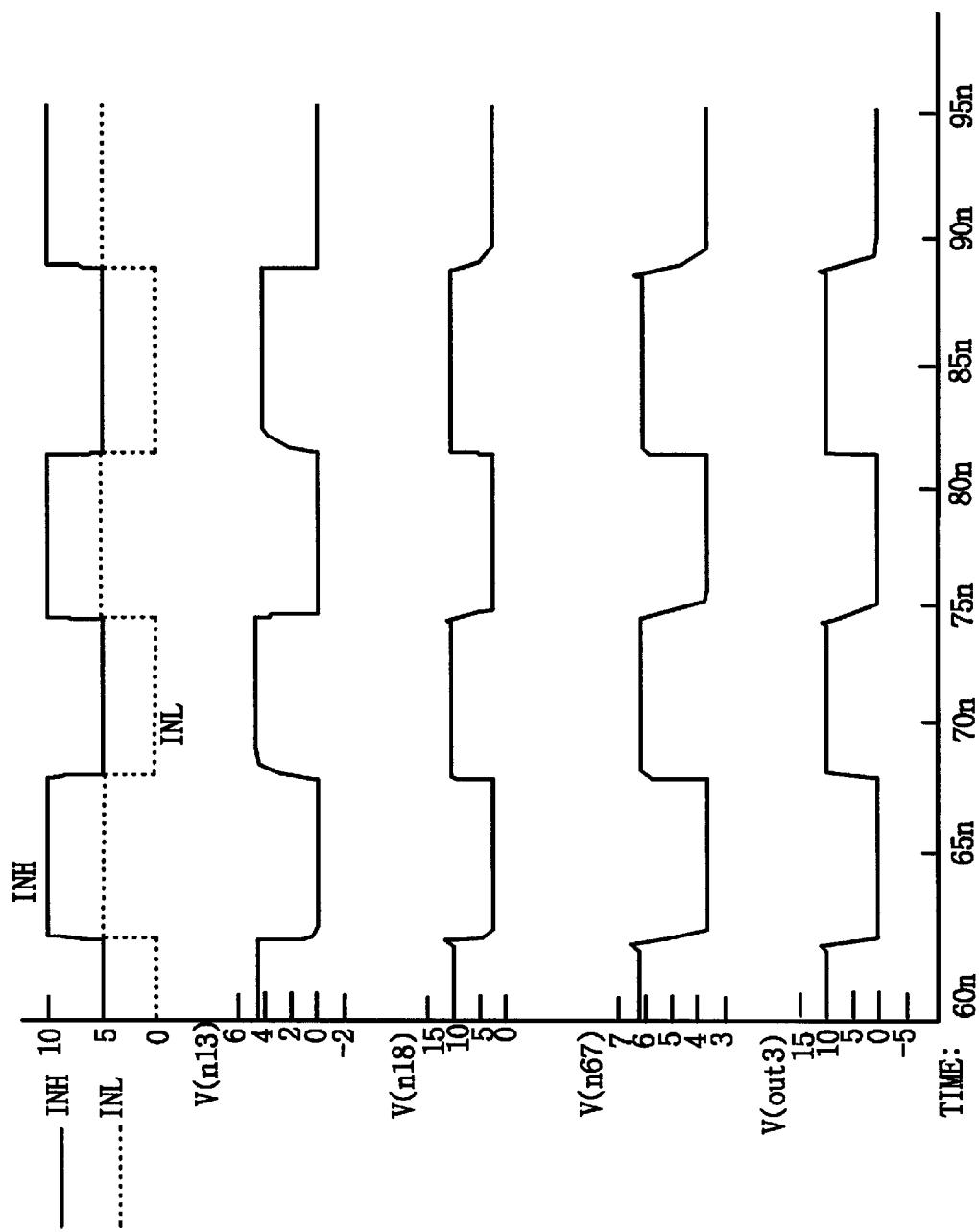
FIG. 3 shows voltage wave forms of major nodes of an inverter for outputting high voltage of the present invention.

Thus, the node N67, node N18, and node 13 are 6V, 10V, and 5V, respectively to supply the node OUT with 10V (VDD). Therefore, the circuit operates within breakdown voltage of low voltage CMOS transistors, and DC voltage is not applied continuously as the gate input N67 of the second PMOS and NMOS P2 and N2 ranges between 4 and 6V an accordance with input voltage. Wave forms of such operations at respective nodes are shown in FIG. 3.

A capacitor C1 prevents overshoot when voltage at the node N67 experiences transition. Accordingly, the present invention requires no shield voltage generator and increases reliance of the circuit as shield voltage is changed not by supplying continuously the gate input of the second PMOS and NMOS P2 and N2 with DC voltage but by input voltage. Moreover, the chip size is reduced as the shield voltage generator is unnecessary.

It will be apparent to those skilled in the art that various modifications and variations can be made in an inverter for outputting high voltage of the present invention without departing from the spirit or scope of the inventions. Thus, it is intended that the present invention cover the modifications and variations of this invention provided they come within the scope of the appended claims and equivalents.

What is claimed is:

1. An inverter for outputting high voltage, wherein an inverter circuit generates high voltage in use of low voltage transistors, the inverter comprising:

a first PMOS of which gate is supplied with a high input signal and of which source is connected to a power supply terminal;

a second PMOS of which source is connected to a drain of the first PMOS and of which drain is connected to an output terminal;

a first NMOS of which gate is connected to a low input signal and of which source is connected to a ground terminal;

a second NMOS of which source is connected to a drain of the first NMOS and of which drain is connected to the output terminal;

a third PMOS of which gate and source is connected to a high input signal and of which drain is connected to a gate of the second PMOS; and a third NMOS of which gate and source are connected to a low input signal and of which drain is connected to a gate of the second NMOS and the drain of the third PMOS.

2. The inverter for outputting high voltage according to claim 1, wherein the NMOSs and PMOSs have predetermined rated voltage which is not only higher than half of output voltage but also lower than the output voltage.

3. The inverter for outputting high voltage according to claim 1, wherein voltage fluctuation of the high input signal ranges between (VDD+VSS)/2 and VDD.

4. The inverter for outputting high voltage according to claim 1, wherein voltage fluctuation of the low input signal ranges between (VDD+VSS)/2 and VDD.

5. The inverter for outputting high voltage according to claim 1, wherein a phase of the high input signal is as good as that of the low input signal.

6. The inverter for outputting high voltage according to claim 1, wherein the inverter further comprises a capacitor between the ground terminal and a node at which the drains of the third PMOS and NMOS meet each other.

7. The inverter for outputting high voltage according to claim 2, wherein the inverter further comprises a capacitor between the ground terminal and a node at which the drains of the third PMOS and NMOS meet each other.

8. The inverter for outputting high voltage according to claim 3, wherein the inverter further comprises a capacitor between the ground terminal and a node at which the drains of the third PMOS and NMOS meet each other.

9. The inverter for outputting high voltage according to claim 4, wherein the inverter further comprises a capacitor between the ground terminal and a node at which the drains of the third PMOS and NMOS meet each other.

10. The inverter for outputting high voltage according to claim 5, wherein the inverter further comprises a capacitor between the ground terminal and a node at which the drains of the third PMOS and NMOS meet each other.

* * * * *